US011783992B2

(12) United States Patent
Wei et al.

(10) Patent No.: US 11,783,992 B2
(45) Date of Patent: Oct. 10, 2023

(54) INTEGRALLY-FORMED INDUCTOR AND A FABRICATIN METHOD THEREOF

(71) Applicant: CYNTEC CO., LTD., Hsinchu (TW)

(72) Inventors: Pei-I Wei, Hsinchu County (TW); Cheng-Hao Chang, New Taipei (TW); Shing Tak Li, Hsinchu (TW)

(73) Assignee: CYNTEC CO., LTD., Hsinchu (TW)

( * ) Notice: Subject to any disclaimer, the term of this patent is extended or adjusted under 35 U.S.C. 154(b) by 496 days.

(21) Appl. No.: 16/936,435

(22) Filed: Jul. 23, 2020

(65) Prior Publication Data

US 2021/0074470 A1   Mar. 11, 2021

Related U.S. Application Data

(60) Provisional application No. 62/896,586, filed on Sep. 6, 2019.

(51) Int. Cl.
| | |
|---|---|
| *H01F 27/29* | (2006.01) |
| *H01F 17/02* | (2006.01) |
| *H01F 27/02* | (2006.01) |
| *H01F 27/28* | (2006.01) |
| *H01F 41/00* | (2006.01) |
| *H05K 1/18* | (2006.01) |

(52) U.S. Cl.
CPC ........... *H01F 27/292* (2013.01); *H01F 17/02* (2013.01); *H01F 27/022* (2013.01); *H01F 27/2828* (2013.01); *H01F 41/005* (2013.01); *H05K 1/181* (2013.01); *H05K 2201/1003* (2013.01)

(58) Field of Classification Search
CPC ...... H01F 27/292; H01F 17/02; H01F 27/022; H01F 27/2828; H01F 41/005; H05K 1/181; H05K 2201/1003
See application file for complete search history.

(56) References Cited

U.S. PATENT DOCUMENTS

| | | | |
|---|---|---|---|
| 8,456,273 B2* | 6/2013 | Chen ...................... | H01C 17/06 338/307 |
| 2003/0029830 A1* | 2/2003 | Takaya ................. | H05K 1/0373 216/13 |
| 2005/0181684 A1* | 8/2005 | Ito ......................... | H05K 3/3442 439/894 |
| 2006/0049907 A1* | 3/2006 | Liu ........................ | H01F 27/027 336/200 |
| 2009/0128275 A1* | 5/2009 | Yagasaki ................. | H01F 17/04 336/83 |

(Continued)

*Primary Examiner* — Marlon T Fletcher
*Assistant Examiner* — Malcolm Barnes
(74) *Attorney, Agent, or Firm* — Min-Lee Teng

(57) ABSTRACT

An inductive component is disclosed, the inductive component comprising a metal structure, comprising a bare conductor wire, a first electrode and a second electrode, wherein the first electrode and the second electrode are integrally formed with the bare conductor wire, wherein a first thickness of the first electrode is greater than that of the bare conductor wire and a second thickness of the second electrode is greater than that of the bare conductor wire; and a magnetic body encapsulating the bare conductor wire, at least one portion of the first electrode, and at least one portion of the second electrode, wherein the first lateral surface of the first electrode and the second lateral surface of the second electrode are embedded inside the magnetic body.

18 Claims, 10 Drawing Sheets

(56) References Cited

U.S. PATENT DOCUMENTS

| | | | | |
|---|---|---|---|---|
| 2010/0289609 A1* | 11/2010 | Liao | .......................... | B22F 3/12 |
| | | | | 336/221 |
| 2012/0019334 A1* | 1/2012 | Hirai | ..................... | H01F 17/02 |
| | | | | 333/32 |
| 2014/0167902 A1* | 6/2014 | Yoon | ..................... | H01F 27/292 |
| | | | | 336/207 |
| 2014/0176284 A1* | 6/2014 | Lee | ..................... | H01F 17/0013 |
| | | | | 336/200 |
| 2014/0203900 A1* | 7/2014 | Bae | .......................... | H01F 3/10 |
| | | | | 427/116 |
| 2014/0218150 A1* | 8/2014 | Cho | ........................ | H01F 41/12 |
| | | | | 336/92 |
| 2016/0055954 A1* | 2/2016 | Huang | ................... | H01F 17/06 |
| | | | | 336/83 |
| 2017/0032887 A1* | 2/2017 | Hamada | ................ | H01F 27/255 |
| 2019/0237245 A1* | 8/2019 | Ashizawa | ............. | H01F 27/255 |
| 2019/0311832 A1* | 10/2019 | Tanabe | .................. | H01G 4/005 |
| 2020/0075219 A1* | 3/2020 | Matsumoto | ......... | H01F 27/2852 |
| 2020/0105456 A1* | 4/2020 | Kim | .................... | H01F 27/2804 |

\* cited by examiner providing a metal plate    401

forming a metal structure by removing unwanted portions of the metal plate, said metal structure comprising a bare conductor wire, a first electrode and a second electrode, wherein the first electrode and the second electrode are integrally formed with the bare conductor wire, wherein a first thickness of the first electrode is greater than that of the bare conductor wire and a second thickness of the second electrode is greater than that of the bare conductor wire    402

forming a magnetic body to encapsulate the bare conductor wire, and a first portion of the first electrode and the second electrode, wherein a first lateral surface of the first electrode and a second lateral surface of the second electrode are embedded inside the magnetic body    403

FIG. 4A

INTEGRALLY-FORMED INDUCTOR AND A FABRICATIN METHOD THEREOF

CROSS-REFERENCES TO RELATED APPLICATIONS

This application claims the benefit of U.S. Provisional Patent Application No. 62/896,586 filed on Sep. 6, 2019, which is hereby incorporated by reference herein and made a part of specification.

BACKGROUND OF THE INVENTION

I. Field of the Invention

The present invention relates to an electrical component, and in particularly, to an inductor having integrally-formed electrodes.

II. Description of the Prior Art

An integrally-formed inductor is made by encapsulating a conductor wire or a coil with a magnetic body instead of winding the conductor wire around an existing magnetic core. Since an integrally-formed inductor has many advantages, such as smaller volume, lower impedance and the endurance for sustain larger current, it has been widely adopted in electronic products that require smaller size, lower power consumption and higher performance.

A known process of making an integrally-formed inductor with low-inductance is illustrated in FIG. 1, including the steps of: (step 1) preparing a coil (e.g., a straight-line-type coil 11 illustrated in FIG. 1); (step 2) adopting a magnetic powder material and performing a thermal-compression process to form an integrally-formed magnetic body 12 encapsulating the straight-line-type coil 11; (step 3) trimming the excessive straight-line-type coil 11 exposed outside of the magnetic body 12; (step 4) performing an electroplating process on two surfaces of the magnetic body 12 to form electrodes 13 which are electrically connected to the straight-line-type coil 11. Because the integrally-formed inductor has a smaller size and the line width of the straight-line-type coil 11 is usually only 60 μm~70 μm, it is very difficult to fix the straight-line-type coil 11 in the process of forming the integrally-formed inductor; in another aspect, the electrodes 13 formed by the electroplating process can cause instability of the contact resistance, and hence impact the electrical performance of the inductor and reduce the yield rate of the inductor.

Another known process of making an integrally-formed inductor is illustrated in FIG. 2, which includes the steps of; connecting an electrode 14 to the two ends of the straight-line-type coil 11; adopting a magnetic powder material and performing a thermal-compression process to form an integrally-formed magnetic body 12 to encapsulate the straight-line-type coil 11; trimming the electrode 14 according to a design length, bending/modeling the electrode 14 exposed outside the magnetic body 12 so as to adhere the electrode 14 to a lateral surface of the magnetic body 12. Although the structure of the electrode 14 can solve the problem as mentioned in the structure electrode 13 formed by the electroplate process, however, in the structure of the electrode 14, the cross section area of the straight-line-type coil 11 is so small that the joint point 15 between the straight-line-type coil 11 and the electrode 14 will easily rupture from the bending of the electrode 14.

SUMMARY OF THE INVENTION

One objective of present invention is to provide an integrally-formed inductive component such as an inductor to increase the mechanical strength between the electrodes and the bare metal wire of the inductive component as well as to reduce the thickness of the inductive component.

In one embodiment, the present invention discloses an inductive component, the inductive component, comprising a metal structure, comprising a bare conductor wire, a first electrode and a second electrode, wherein the first electrode and the second electrode are integrally formed with the bare conductor wire so as to form a unitary body comprising the first electrode, the second electrode, and the bare conductor wire, wherein a first thickness of the first electrode is greater than that of the bare conductor wire and a second thickness of the second electrode is greater than that of the bare conductor wire, wherein a contiguous metal path is formed from a first lateral surface of the first electrode to a second lateral surface of the second electrode via the bare conductor wire; and a magnetic body encapsulating the bare conductor wire, at least one portion of the first electrode, and at least one portion of the second electrode, wherein the first lateral surface of the first electrode and the second lateral surface of the second electrode are embedded inside the magnetic body.

In one embodiment, a first top surface of the first electrode is exposed from the magnetic body. In one embodiment, a first bottom surface of the first electrode is exposed from the magnetic body.

In one embodiment, a second top surface of the second electrode is exposed from the magnetic body. In one embodiment, a second bottom surface of the first electrode is exposed from the magnetic body.

In one embodiment, at least one first metal layer is disposed on a top surface of the first electrode, wherein a first top surface of the at least one first metal layer is exposed from the magnetic body.

In one embodiment, at least one second metal layer is disposed on a top surface of the second electrode, wherein a second top surface of the at least one second metal layer is exposed from the magnetic body.

In one embodiment, the metal structure comprises copper.
In one embodiment, the metal structure is made of copper.
In one embodiment, the at least one first metal layer comprises nickel.
In one embodiment, the at least one second metal layer comprises nickel.

In one embodiment, the first top surface of the first electrode is higher than a top surface of the bare conductor wire by at least 20 um.
In one embodiment, the second top surface of the second electrode is higher than said top surface of the bare conductor wire by at least 20 um.

In one embodiment, the inductive component is an inductor.
In one embodiment, the bare conductor wire comprises a curved line.
In one embodiment, the bare conductor wire comprises a spiral coil.

In one embodiment, a first outer lateral surface of the first electrode and/or a second outer lateral surface of the second electrode 303 are embedded inside the magnetic body 304.
In one embodiment, the first outer lateral surface of the first electrode 302 is the outermost boundary of the metal structure.

In one embodiment, the second outer lateral surface of the second electrode 303 is the outermost boundary of the metal structure.

In one embodiment, the first electrode and the second electrode are at two opposite sides of the bare conductor wire.

In one embodiment, the first electrode and the second electrode are at a same side of the bare conductor wire.

In one embodiment, the first electrode comprises a first upper portion above the bare conductor wire and a first lower portion below the bare conductor wire, wherein the first lateral surface of the first upper portion of the first electrode and a third lateral surface of the first lower portion of the first electrode 302 are embedded inside the magnetic body.

In one embodiment, the second electrode comprises an upper portion above the bare conductor wire and a lower portion below the bare conductor wire. wherein the second electrode comprises a second upper portion above the bare conductor wire and a second lower portion below the bare conductor wire, wherein the second lateral surface of the second upper portion of the second electrode and a fourth lateral surface of the second lower portion of the second electrode are embedded inside the magnetic body.

In one embodiment, the inductor is embedded inside a circuit board, wherein the first electrode and the second electrode are electrically connected to the circuit board.

In one embodiment, the first electrode and the second electrode are respectively electrically connected to an upper conductive layer and a lower conductive layer of the circuit board.

In one embodiment, the first electrode and the second electrode are respectively electrically connected to an upper conductive layer and a lower conductive layer of the circuit board.

In one embodiment, the present invention discloses a method to form an inductor, the method comprising: providing a metal plate; forming a metal structure by removing unwanted portions of the metal plate, said metal structure comprising a bare conductor wire, a first electrode and a second electrode, wherein the first electrode and the second electrode are integrally formed with the bare conductor wire, wherein a first thickness of the first electrode is greater than that of the bare conductor wire and a second thickness of the second electrode is greater than that of the bare conductor wire, wherein a contiguous metal path is formed from a first lateral surface of the first electrode to a second lateral surface of the second electrode via the bare conductor wire; and forming a magnetic body to encapsulate the bare conductor wire, and a first portion of the first electrode and the second electrode, wherein a first lateral surface of the first electrode and a second lateral surface of the second electrode are embedded inside the magnetic body.

In one embodiment, a first top surface of the first electrode and a second top surface of the second electrode are exposed from the magnetic body.

In one embodiment, the step of forming the metal structure by removing unwanted portions of the metal plate comprises the sub-steps of: removing at least one first portion of the metal plate to form a first electrode and a second electrode along two edges of the metal plate, wherein a contiguous metal path is formed from the first electrode to the second electrode via a remaining portion of the metal plate between the first electrode and the second electrode; and removing at least one second portion of said remaining portion of the metal plate to form a bare conductor wire between the first electrode and the second electrode.

In one embodiment, the inductive component is a choke.

In one embodiment, the bare conductor wire is a straight wire.

In one embodiment, the bare conductor wire is an arc-type coil or curved-line coil.

In one embodiment, the magnetic body is integrally formed to encapsulate the bare conductor wire.

In one embodiment, the present invention discloses an inductive component, the inductive component, comprising a metal structure, comprising a bare conductor wire, a first electrode and a second electrode, wherein the first electrode and the second electrode are integrally formed with the bare conductor wire so as to form a unitary body comprising the first electrode, the second electrode, and the bare conductor wire, wherein a first thickness of the first electrode is greater than that of the bare conductor wire and a second thickness of the second electrode is greater than that of the bare conductor wire, wherein a contiguous metal path is formed from a first lateral surface of the first electrode to a second lateral surface of the second electrode via the bare conductor wire, wherein a first width of the first electrode is greater than a thickness of the bare conductor wire and a second width of the second electrode is greater than said thickness of the bare conductor wire.

The detailed technology and above preferred embodiments implemented for the present invention are described in the following paragraphs accompanying the appended drawings for people skilled in this field to well appreciate the features of the claimed invention.

BRIEF DESCRIPTION OF THE DRAWINGS

The foregoing aspects and many of the accompanying advantages of this invention will become more readily appreciated as the same becomes better understood by reference to the following detailed description when taken in conjunction with the accompanying drawings, wherein:

FIG. 4A illustrates a flow chart of a method to form an inductive component according to one embodiment of the present invention;

DETAIL DESCRIPTION OF THE INVENTION

The detailed explanation of the present invention is described as following. The described preferred embodiments are presented for purposes of illustrations and description and they are not intended to limit the scope of the present invention.

Figure 1:
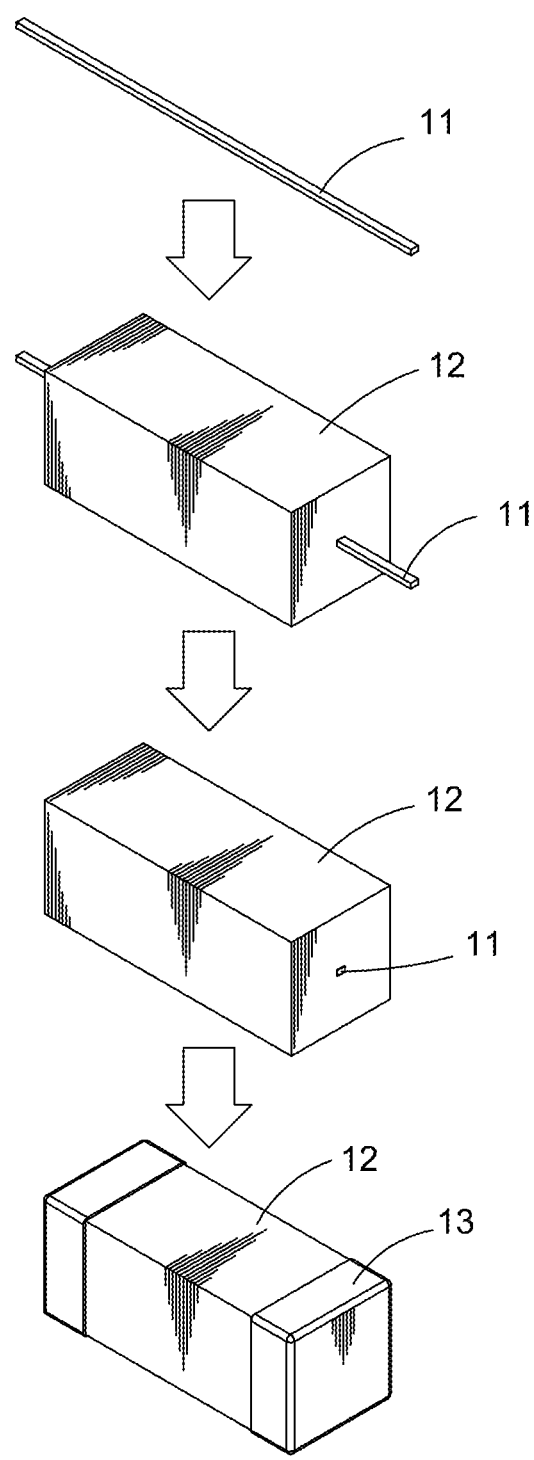
FIG. 1 illustrates a process for a known low-inductance inductor.
Figure 2:
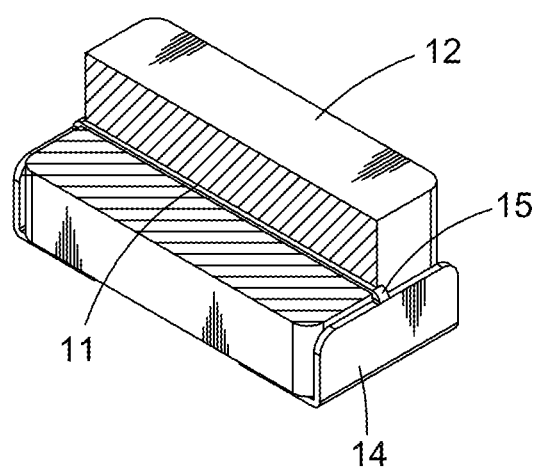
FIG. 2 illustrates a structure of another known integrally-formed inductor.
Figure 3A:
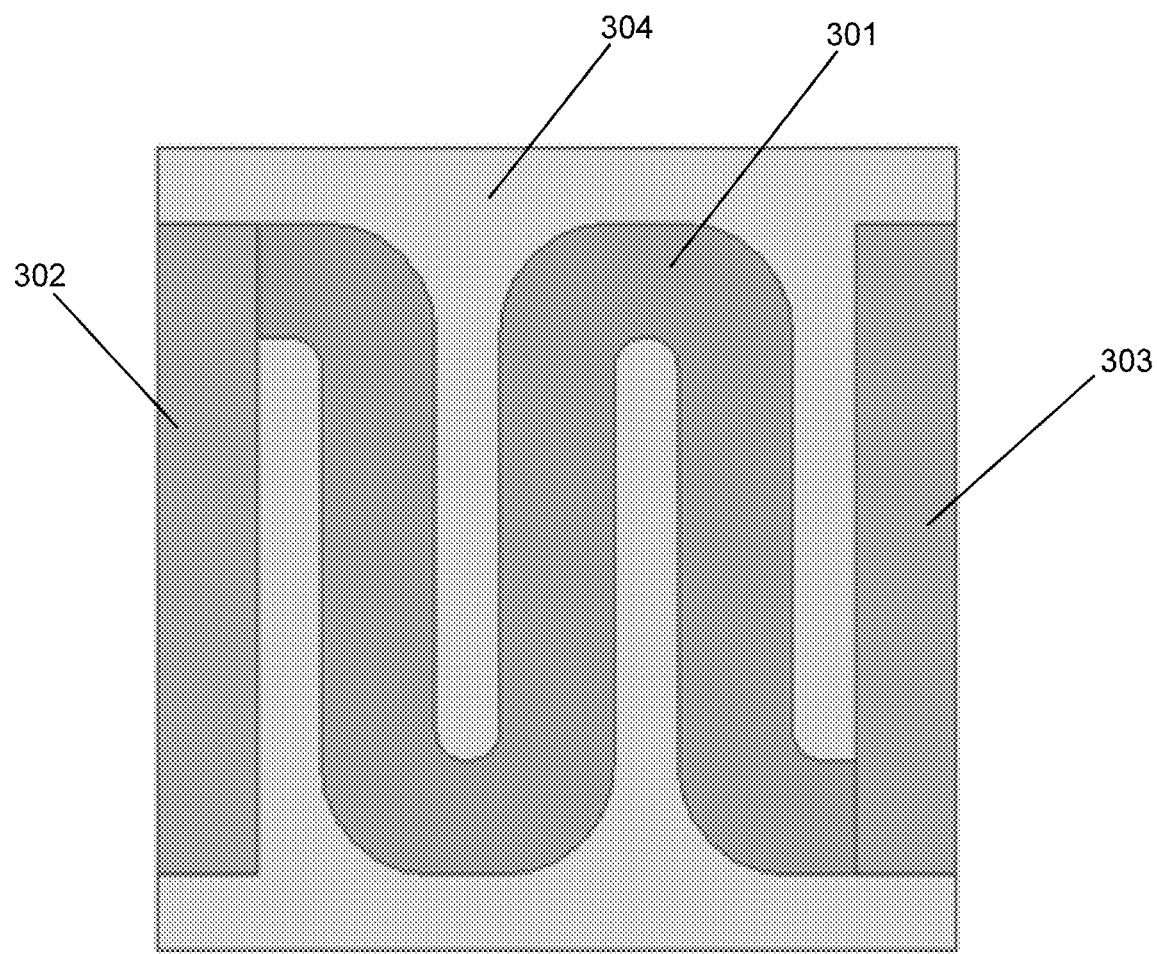
FIG. 3A-3B illustrates an exemplary structure of an inductive component according to one embodiment of the present invention.
Figure 3B:
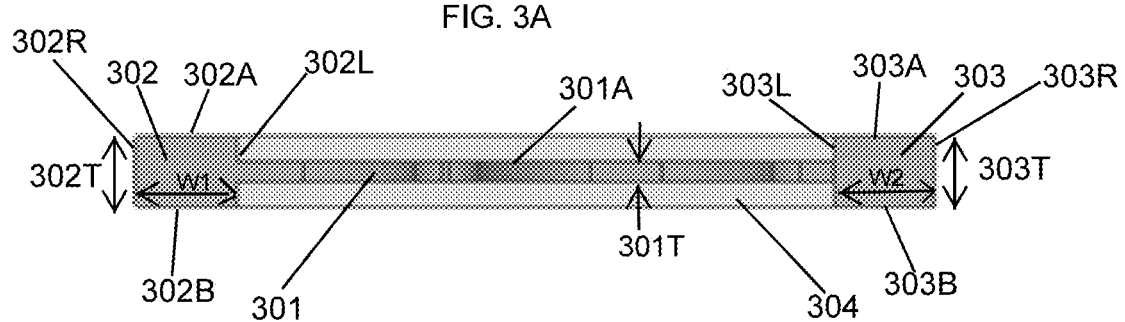

Please refer to FIG. 3A and FIG. 3B, which illustrates an exemplary structure of the integrally-formed inductive component in accordance with one embodiment of the present invention, wherein FIG. 3A shows the top view of the inductive component and FIG. 3B shows a side view of the inductive component, wherein the inductive component comprises: a metal structure, comprising a bare conductor wire 301, a first electrode 302 and a second electrode 303, wherein the first electrode 302 and the second electrode 303 are integrally formed with the bare conductor wire 301, wherein a thickness 302T of the first electrode 302 is greater than a thickness 301T of the bare conductor wire 301 and a thickness 303T of the second electrode 303 is greater than the thickness 301T of the bare conductor wire 301, wherein a contiguous metal path is formed from a first lateral surface 302L of the first electrode 302 to a second lateral surface 303L of the second electrode 303 via the bare conductor wire 301; and a magnetic body 304 encapsulating the bare conductor wire 301, at least one portion of the first electrode 302, and at least one portion of the second electrode 303, wherein the first lateral surface 302L of the first electrode 302 and the second lateral surface 303L of the second electrode 303 are embedded inside the magnetic body 304, that is, a first portion and a second portion of the magnetic body 304 are at two opposite sides of the first lateral surface 302L of the first electrode 302; and a third portion and a fourth portion of the magnetic body 304 are at two opposite sides of the second lateral surface 303L of the second electrode 303.

In one embodiment, the first lateral surface 302L has a rectangular or a square shape or a circular shape or a suitable shape. In one embodiment, the second lateral surface 303L has a rectangular or a square shape or a circular shape or a suitable shape.

In one embodiment, the first electrode 302 comprises a top surface, a bottom surface and four lateral surfaces, wherein the magnetic body 304 encapsulates at least two of the four lateral surfaces. In one embodiment, the magnetic body 304 encapsulates at least three of the four lateral surfaces. In one embodiment, the magnetic body 304 encapsulates the four lateral surfaces.

In one embodiment, the second electrode 303 comprises a top surface, a bottom surface and four lateral surfaces, wherein the magnetic body 304 encapsulates at least two of the four lateral surfaces of the second electrode 303. In one embodiment, the magnetic body 304 encapsulates at least three of the four lateral surfaces of the second electrode 303. In one embodiment, the magnetic body 304 encapsulates the four lateral surfaces of the second electrode 303.

Figure 3C:
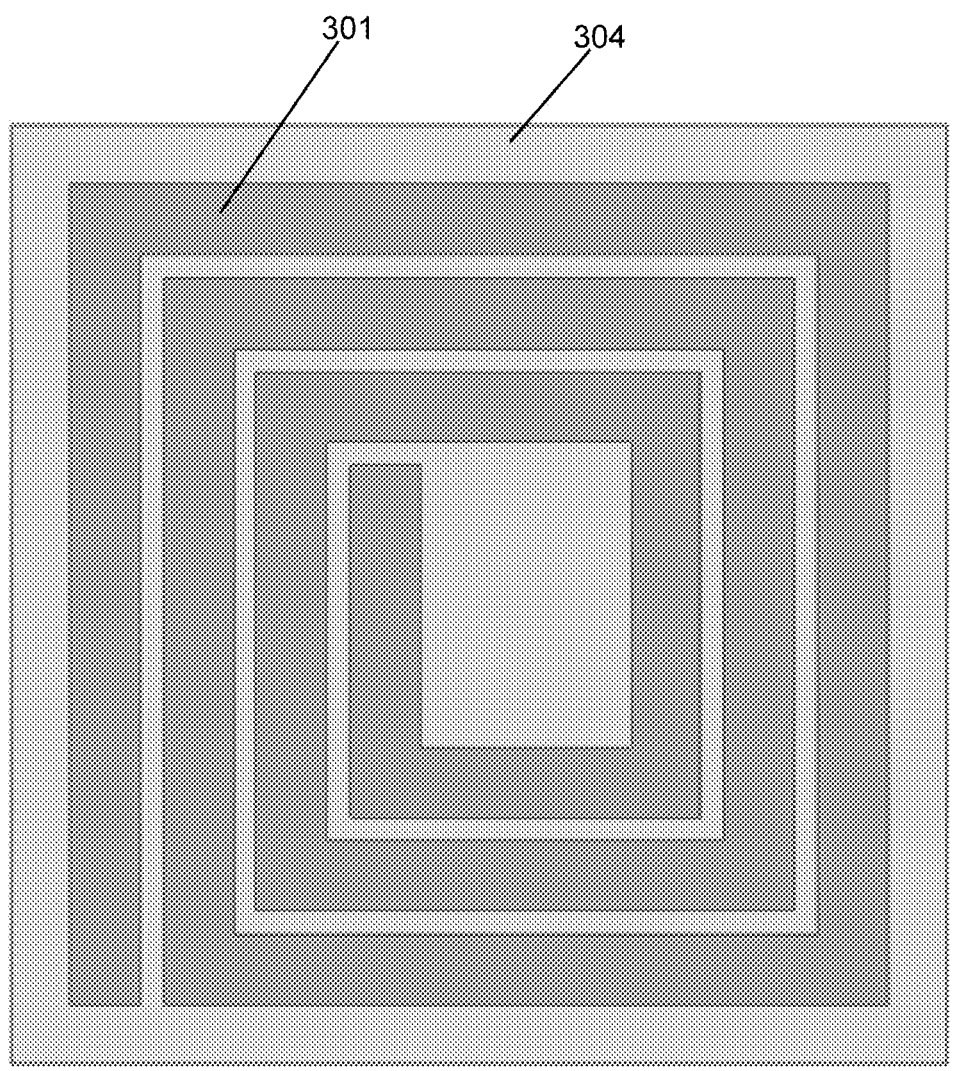
FIG. 3C-3D illustrates another exemplary structure of an inductive component according to one embodiment of the present invention.
Figure 3D:
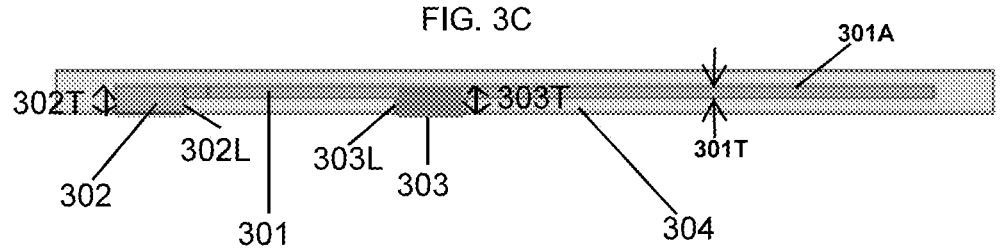

Please refer to FIG. 3C and FIG. 3D, which illustrates an exemplary structure of the integrally-formed inductive component in accordance with one embodiment of the present invention, wherein FIG. 3C shows the top view of the inductive component and FIG. 3D shows a side view of the inductive component, wherein the inductive component comprises: a metal structure, comprising a bare conductor wire 301, a first electrode 302 and a second electrode 303, wherein the first electrode 302 and the second electrode 303 are integrally formed with the bare conductor wire 301, wherein a thickness 302T of the first electrode 302 is greater than a thickness 301T of the bare conductor wire 301 and a thickness 303T of the second electrode 303 is greater than the thickness 301T of the bare conductor wire 301, wherein a contiguous metal path is formed from a first lateral surface 302L of the first electrode 302 to a second lateral surface 303L of the second electrode 303 via the bare conductor wire 301; and a magnetic body 304 encapsulating the bare conductor wire 301, at least one portion of the first electrode 302, and at least one portion of the second electrode 303, wherein the first lateral surface 302L of the first electrode 302 and the second lateral surface 303L of the second electrode 303 are embedded inside the magnetic body 304, that is, a first portion and a second portion of the magnetic body 304 are at two opposite sides of the first lateral surface 302L of the first electrode 302; and a third portion and a fourth portion of the magnetic body 304 are at two opposite sides of the second lateral surface 303L of the second electrode 303.

In one embodiment, the inductive component is an inductor.

In one embodiment, the inductive component is a choke.

In one embodiment, the height of the inductor is not greater than 450 um.

In one embodiment, the height of the inductor is not greater than 50 um.

In one embodiment, the bare conductor wire 301 comprises a curved line, as shown in FIG. 3A.

In one embodiment, the bare conductor wire 301 comprises a spiral coil, as shown in FIG. 3C.

In one embodiment, a first top surface 302A of the first electrode 302 is exposed from the magnetic body. In one embodiment, a width W1 of the first electrode 302 is greater than a thickness 301T of the bare conductor wire 301.

In one embodiment, a second top surface 303A of the second electrode 303 is exposed from the magnetic body. In one embodiment, a width W2 of the second electrode 303 is greater than a thickness 301T of the bare conductor wire 301.

In one embodiment, a first outer lateral surface 302R of the first electrode 302 is embedded inside the magnetic body; in one embodiment, a second outer lateral surface 303R of the second electrode 303 is embedded inside the magnetic body.

In one embodiment, the first outer lateral surface 302R of the first electrode 302 is the outermost boundary of the metal structure. In one embodiment, the second outer lateral surface 303R of the second electrode 303 is the outermost boundary of the metal structure.

In one embodiment, the first electrode 302 can use both of the top surface 302A and the bottom surface 302B of the first electrode 302 to connect with an external circuit. In one embodiment, the second electrode 303 can use both of the top surface 303A and the bottom surface 303B of the second electrode 303 to connect with an external circuit.

The electrodes 302, 303 can be in many different forms, such as the forms shown in FIG. 3E, FIG. 3F, FIG. 3G, FIG. 3H, each of which shows a side view of the inductive component, and shown in FIG. 3I, FIG. 3J, FIG. 3K, FIG. 3L each of which shows a 3D view of the inductive component. In one embodiment, the bare conductor wire 301 is a straight wire, as shown in FIG. 3I, FIG. 3J, FIG. 3K, FIG. 3L. In one embodiment, the bare conductor wire 301 in FIG. 3E, FIG. 3F, FIG. 3G, FIG. 3H can be a conductive wire 301 in FIG. 3A-3B or in FIG. 3C-3D. In one embodiment, the metal structure shown in FIG. 3E-3L can be made by placing a metal material in a mold.

Figure 3E:
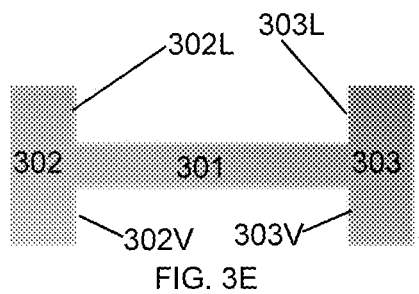
FIG. 3E-3H illustrates a side view of different forms of the electrodes according to one embodiment of the present invention.
Figure 3I:
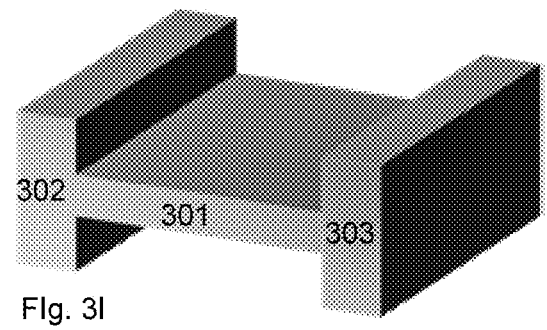
FIG. 3I-3L illustrates a 3D-view of different forms of the electrodes according to one embodiment of the present invention.

In one embodiment, the first electrode 302 comprises a first upper portion above the bare conductor wire 301 and a first lower portion below the bare conductor wire 301, wherein the first lateral surface 302L of the first upper portion of the first electrode 302 and a third lateral surface 302V of the first lower portion of the first electrode 302, as shown in FIG. 3E, can be embedded inside the magnetic body.

In one embodiment, the second electrode comprises an upper portion above the bare conductor wire 301 and a lower portion below the bare conductor wire 301, wherein the second lateral surface 303L of the upper portion of the second electrode 303 and a fourth lateral surface 303V of the lower portion of the second electrode 303, as shown in FIG. 3E, can be embedded inside the magnetic body.

Figure 3F:
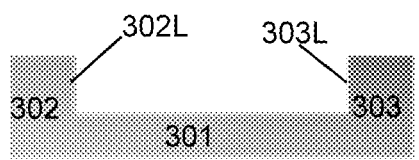
Figure 3J:
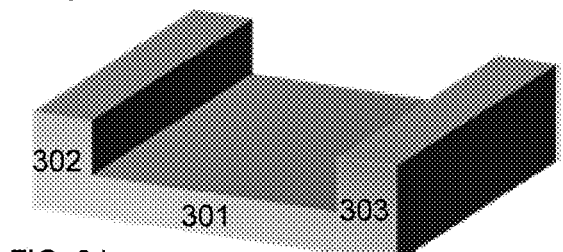

In one embodiment, the first electrode 302 and the second electrode 303 are at a same side of the bare conductor wire 301, as shown in FIG. 3F.

Figure 3G:
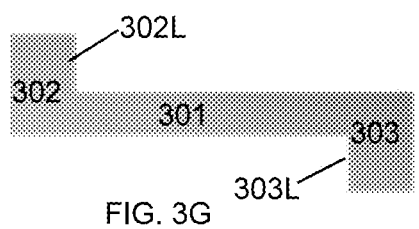
Figure 3K:
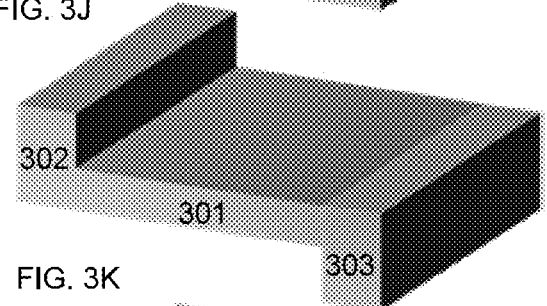

In one embodiment, the first electrode 302 and the second electrode 303 are at two opposite sides of the bare conductor wire, as shown in FIG. 3G.

Figure 3H:
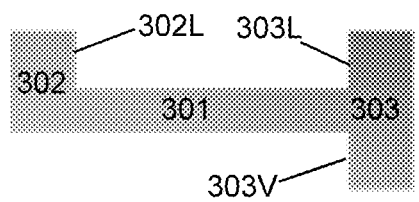
Figure 3L:
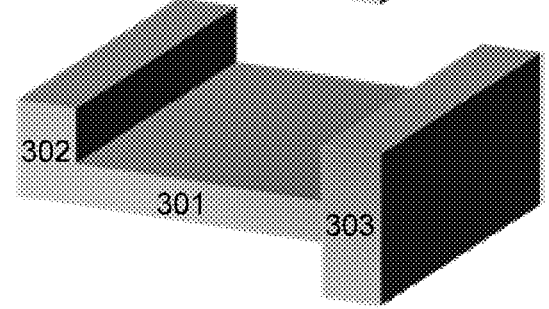

In one embodiment, only one of the electrode, such as the second electrode, comprises an upper portion above the bare conductor wire 301 and a lower portion below the bare conductor wire 301, wherein the first lateral surface 302L of the first electrode 302, the second lateral surface 303L of the upper portion of the second electrode 303 and a fourth lateral surface 303V of the lower portion of the second electrode 303, as shown in FIG. 3H, can be embedded inside the magnetic body.

In one embodiment, at least one first metal layer is disposed on a top surface of the first electrode.

In one embodiment, at least one second metal layer is disposed on a top surface of the second electrode.

In one embodiment, the metal structure comprises copper.

In one embodiment, the metal structure is made of copper.

In one embodiment, the at least one first metal layer comprises nickel.

In one embodiment, the at least one second metal layer comprises nickel.

In one embodiment, a distance between the first top surface of the first electrode 302 and a top surface 301A of the bare conductor wire 301 is at least 20 um, as shown in FIG. 3B.

In one embodiment, a distance between the second top surface of the second electrode 303 and a top surface 301A of the bare conductor wire 301 is at least 20 um, as shown in FIG. 3B.

In one embodiment, FIG. 4A shows a method to form an inductor, wherein the method comprises: step 401: providing a metal plate; step 402: forming a metal structure by removing unwanted portions of the metal plate, said metal structure comprising a bare conductor wire, a first electrode and a second electrode, wherein the first electrode and the second electrode are integrally formed with the bare conductor wire, wherein a first thickness of the first electrode is greater than that of the bare conductor wire and a second thickness of the second electrode is greater than that of the bare conductor wire, wherein a contiguous metal path is formed from a first lateral surface of the first electrode to a second lateral surface of the second electrode via the bare conductor wire; and step 403: forming a magnetic body to encapsulate the bare conductor wire, and a first portion of the first electrode and the second electrode, wherein a first lateral surface of the first electrode and a second lateral surface of the second electrode are embedded inside the magnetic body. Removing unwanted portions of the metal plate can be made by physical ways such as punching or chemical ways such as itching, or by other suitable ways.

In one embodiment, a first top surface of the first electrode 301 and a second top surface of the second electrode 302 are exposed from the magnetic body.

Figure 4B:
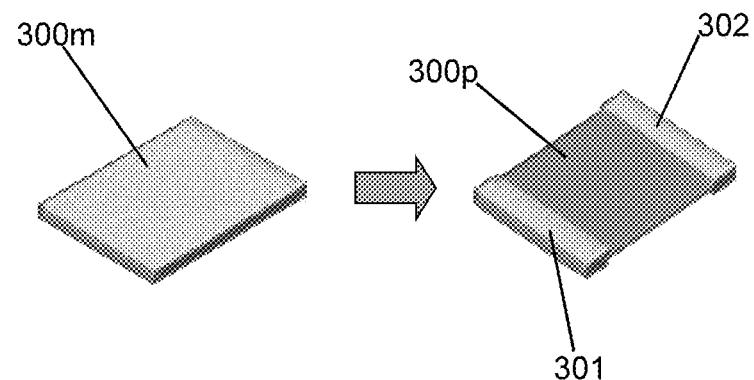
FIG. 4B-4D illustrates an example to form an inductive component according to one embodiment of the present invention.
Figure 4C:
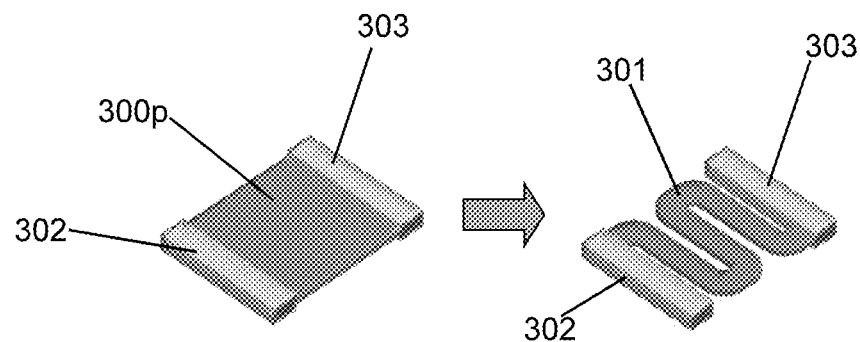
Figure 4D:
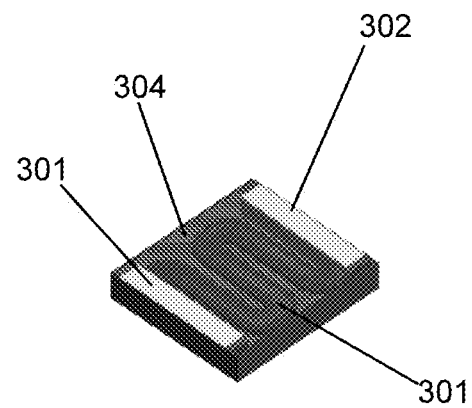

In one embodiment, the step of forming the metal structure by removing unwanted portions of the metal plate 300m comprises the sub-steps of: removing at least one first portion of the metal plate 300m to form a first electrode 302 and a second electrode 302, as shown in FIG. 4B, wherein a contiguous metal path is formed from the first electrode 302 to the second electrode 303 via a remaining portion of the metal plate 300p between the first electrode 302 and the second electrode 303; and removing at least one second portion of said remaining portion of the metal plate 300p to form a bare conductor wire 301 between the first electrode 302 and the second electrode 303 as shown in FIG. 4C, and then forming a magnetic body 304 to encapsulate the bare conductor wire 301, and a portion of the first electrode 302 and a portion of the second electrode 303, wherein a first lateral surface 302L of the first electrode 302 and a second lateral surface 303L of the second electrode 303 are embedded inside the magnetic body, as shown in FIG. 4D and FIG. 3B.

Figure 4E:
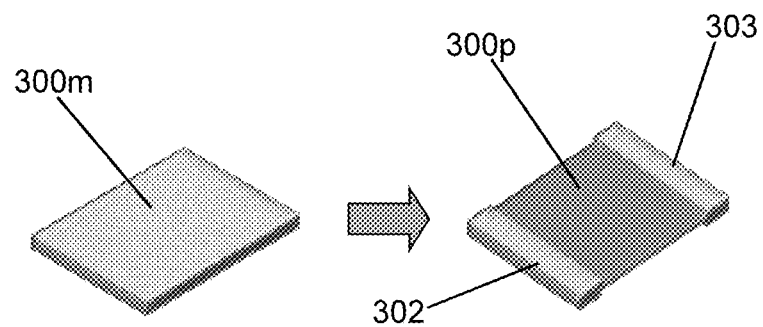
FIG. 4E-4F illustrates another example to form an inductive component according to one embodiment of the present invention.
Figure 4F:
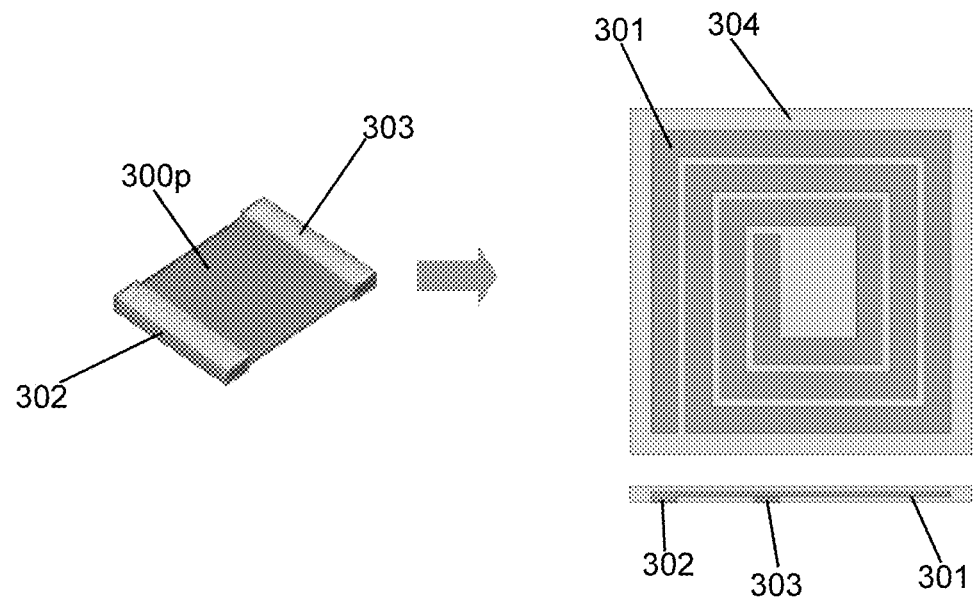

In one embodiment, the step of forming the metal structure by removing unwanted portions of the metal plate comprises the sub-steps of: removing at least one first portion of the metal plate 300m to form a first electrode 302 and a second electrode 303 along two edges of the metal plate 300m, as shown in FIG. 4E, wherein a contiguous metal path is formed from the first electrode 302 to the second electrode 303 via a remaining portion of the metal plate 300p between the first electrode 302 and the second electrode 303; and removing at least one second portion of said remaining portion of the metal plate 300p to form a bare conductor wire 301 between the first electrode 302 and the second electrode 303 as shown in FIG. 4F, and then forming a magnetic body 304 to encapsulate the bare conductor wire 301, and a portion of the first electrode 302 and a portion of the second electrode 303, wherein a first lateral surface of the first electrode 302 and a second lateral surface of the second electrode 303 are embedded inside the magnetic body 304, as shown in FIG. 4F and FIG. 3B.

In one embodiment, the inductor is embedded inside a circuit board, wherein the first electrode 302 and the second electrode 303 are electrically connected to the circuit board.

In one embodiment, the first electrode 302 and the second electrode 303 are respectively electrically connected to an upper conductive layer and a lower conductive layer of the circuit board.

In one embodiment, each of the first electrode 302 and the second electrode 303 can use both of the top surface and the bottom surface thereof to connect with an upper conductive layer and a lower conductive layer of the circuit board.

Figure 5A:
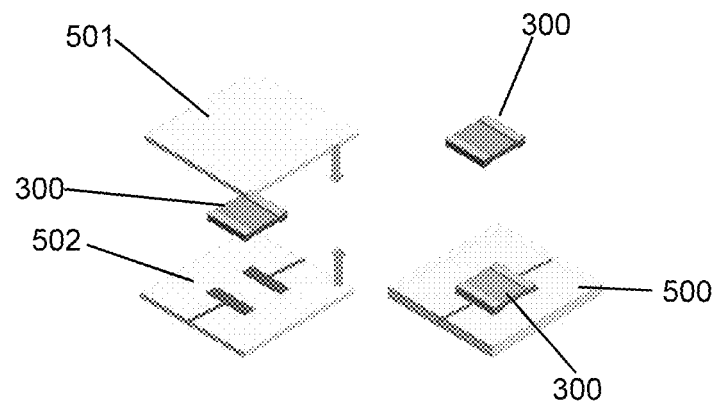
FIG. 5A-5C illustrates ways to embed the inductive component in a circuit board.

In one embodiment, as shown in FIG. 5A, wherein the first electrode 302 and the second electrode 303 of the inductive component 300 can be electrically connected to a lower conductive layer on the lower insulating layer or a substrate 502 of the circuit board 500.

Figure 5B:
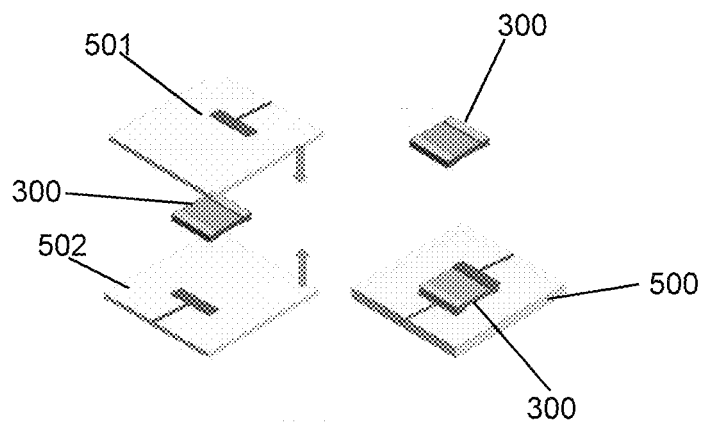

In one embodiment, as shown in FIG. 5B, the first electrode 302 and the second electrode 303 of the inductive component 300 are respectively electrically connected to an upper conductive layer on an upper insulating layer or a substrate 501 and a lower conductive layer on the lower insulating layer or a substrate 502 of the circuit board 500.

Figure 5C:
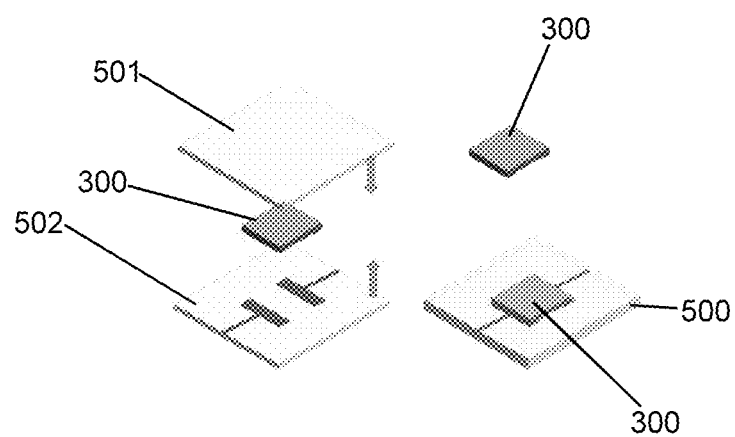

In one embodiment, as shown in FIG. 5C, each of the first electrode 302 and the second electrode 303 of the inductive component 300 only use one surface to connect with the internal circuit of the circuit board, and the first electrode 302 and the second electrode 303 are electrically connected to a lower conductive layer on the lower insulating layer or a substrate 502 of the circuit board 500.

In one embodiment, an inductor is disclosed, wherein the inductor comprises: a metal structure, comprising a bare conductor wire, a first electrode and a second electrode, wherein the first electrode and the second electrode are integrally formed with the bare conductor wire, wherein a first thickness of the first electrode is greater than that of the bare conductor wire and a second thickness of the second electrode is greater than that of the bare conductor wire, wherein a contiguous metal path is formed from a first lateral surface of the first electrode to a second lateral surface of the second electrode via the bare conductor wire; and a magnetic body encapsulating the bare conductor wire, at least one portion of the first electrode, and at least one portion of the second electrode, wherein the first lateral surface of the first electrode and the second lateral surface of the second electrode are embedded inside the magnetic body.

The inductive component or an inductor of the present invention has the following advantages: 1. the electrodes and the bare metal wire are integrated in one piece to reduce the contact resistance between the electrodes and the bare metal wire so as to have a lower DCR (Direct Current Resistance); 2. increase the mechanical strength between the electrodes and the bare metal wire; 3. a thin inductor can be produced for being embedded inside a circuit board and the thickness of the inductor can be controlled between 50 um~500 um; 4. a mass production is possible (sheet type dense array production), the number of single piece inductor can be produced from 500 to tens of thousands in one manufacturing process.

Please refer to FIG. 3A and FIG. 3B, which illustrates an exemplary structure of the integrally-formed inductive component in accordance with one embodiment of the present invention, wherein FIG. 3A shows the top view of the inductive component and FIG. 3B shows a side view of the inductive component, wherein the inductive component comprises: a metal structure, comprising a bare conductor wire 301, a first electrode 302 and a second electrode 303, wherein the first electrode 302 and the second electrode 303 are integrally formed with the bare conductor wire 301, wherein a thickness 302T of the first electrode 302 is greater than a thickness 301T of the bare conductor wire 301 and a thickness 303T of the second electrode 303 is greater than the thickness 301T of the bare conductor wire 301, wherein a contiguous metal path is formed from a first lateral surface 302L of the first electrode 302 to a second lateral surface 303L of the second electrode 303 via the bare conductor wire 301, wherein a first width W1 of the first electrode 302 is greater than a thickness 301T of the bare conductor wire 301 and a second width W2 of the second electrode 303 is greater than said thickness 301T of the bare conductor wire 301; and each of the first electrode 302 and the second electrode 303 is formed without bending from the bare conductor wire 301.

The above disclosure is related to the detailed technical contents and inventive features thereof. People skilled in this field may proceed with a variety of modifications and replacements based on the disclosures and suggestions of the invention as described without departing from the characteristics thereof. Nevertheless, although such modifications and replacements are not fully disclosed in the above descriptions, they have substantially been covered in the following claims as appended.

What is claimed is:

1. An inductive component, comprising:
 a metal structure, comprising a bare conductor wire, a first electrode and a second electrode, wherein the first electrode and the second electrode are integrally formed with the bare conductor wire, wherein the first electrode has a first unitary body having a first top surface and a first bottom surface, and the first unitary body has a first thickness measured from the first top surface to the first bottom surface; the second electrode has a second unitary body having a second top surface and a second bottom surface, and the second unitary body has a second thickness measured from the second top surface to the second bottom surface, wherein the bare conductor wire has a third unitary body having a third top surface and a third bottom surface, and the third unitary body has a third thickness measured from the third top surface to the third bottom surface, wherein the first thickness of the first unitary body of the first electrode is greater than the third thickness of the third unitary body of the bare conductor wire, and the second thickness of the second unitary body of the second electrode is greater than said third thickness of the third unitary body of the bare conductor wire, wherein a first contiguous metal path is formed from a first inner lateral surface of the first unitary body of the first electrode to a second inner lateral surface of the second unitary body of the second electrode via the bare conductor wire; and
 a magnetic body encapsulating the bare conductor wire, at least one portion of the first electrode, and at least one portion of the second electrode, wherein the first inner lateral surface of the first unitary body of the first electrode and the second inner lateral surface of the second unitary body of the second electrode are embedded inside the magnetic body, wherein the first unitary body of the first electrode has a first width measured from a first outer lateral surface to the first inner lateral surface of the first unitary body with the first outer lateral surface and the first inner lateral surface being two opposite lateral surfaces of the first unitary body, wherein said metal structure comprises a unitary portion comprising a second contiguous metal path that extends from the first outer lateral surface of the first unitary body of the first electrode to the third top surface of the third unitary body of the bare conductor wire along a direction of said first width.

2. The inductive component according to claim 1, wherein the first top surface of the first unitary body of the first electrode is exposed from the magnetic body.

3. The inductive component according to claim 2, wherein the second top surface of the second unitary body of the second electrode is exposed from the magnetic body.

4. The inductive component according to claim 1, wherein at least one first metal layer is disposed on the first top surface of the first unitary body of the first electrode, wherein a first top surface of the at least one first metal layer is exposed from the magnetic body.

5. The inductive component according to claim 4, wherein at least one second metal layer is disposed on the second top surface of the second unitary body of the second electrode, wherein a second top surface of the at least one second metal layer is exposed from the magnetic body.

6. The inductive component according to claim 1, wherein the metal structure comprises copper.

7. The inductive component according to claim 1, wherein the metal structure is made of copper.

8. The inductive component according to claim 4, wherein the at least one first metal layer comprises nickel.

9. The inductive component according to claim 5, wherein the at least one second metal layer comprises nickel.

10. The inductive component according to claim 1, wherein a distance between the first top surface of the first unitary body of the first electrode and the third top surface of the third unitary body of the bare conductor wire is at least 20 um.

11. The inductive component according to claim 10, wherein a distance between the second top surface of the second unitary body of the second electrode and the third top surface of the third unitary body of the bare conductor wire is at least 20 um.

12. The inductive component according to claim 1, wherein the inductive component is an inductor.

13. The inductive component according to claim 1, wherein the bare conductor wire comprises a curved line.

14. The inductive component according to claim 1, wherein the bare conductor wire comprises a spiral coil.

15. The inductive component according to claim 1, wherein the first outer lateral surface of the first unitary body of the first electrode and a second outer lateral surface of the second unitary body of the second electrode are embedded inside the magnetic body.

16. The inductive component according to claim 1, wherein the first electrode and the second electrode are located at two opposite sides of the bare conductor wire.

17. The inductive component according to claim 1, wherein the first electrode and the second electrode are located at a same side of the bare conductor wire.

18. The inductive component according to claim 12, wherein the inductor is embedded inside a circuit board, wherein the first electrode and the second electrode are electrically connected to the circuit board.

* * * * *